United States Patent
Tojo et al.

(10) Patent No.: US 7,103,075 B2
(45) Date of Patent: Sep. 5, 2006

(54) SOLID LASER APPARATUS

(75) Inventors: Koji Tojo, Sagamihara (JP); Takashi Fujita, Atsugi (JP); Ichiro Fukushi, Atsugi (JP)

(73) Assignee: Shimadzu Corporation, Kyoto (JP)

( * ) Notice: Subject to any disclaimer, the term of this patent is extended or adjusted under 35 U.S.C. 154(b) by 337 days.

(21) Appl. No.: 10/848,432

(22) Filed: May 18, 2004

(65) Prior Publication Data

US 2004/0258109 A1 Dec. 23, 2004

(30) Foreign Application Priority Data

Jun. 18, 2003 (JP) ............................. 2003-173090
Jun. 24, 2003 (JP) ............................. 2003-178835

(51) Int. Cl.
*H01S 3/10* (2006.01)
*H01S 3/13* (2006.01)
*H01S 3/04* (2006.01)

(52) U.S. Cl. ........................ 372/22; 372/29.02; 372/33; 372/34

(58) Field of Classification Search ................ 372/21, 372/22, 29.02
See application file for complete search history.

(56) References Cited

U.S. PATENT DOCUMENTS

| 5,099,308 A | 3/1992 | Murayama |
| 5,495,489 A * | 2/1996 | Lee et al. ...................... 372/34 |
| 5,544,271 A * | 8/1996 | Lim ............................. 385/122 |
| 5,644,584 A * | 7/1997 | Nam et al. ..................... 372/20 |
| 5,682,398 A * | 10/1997 | Gupta .......................... 372/22 |
| 5,943,353 A * | 8/1999 | Kaneko ........................ 372/34 |
| 6,996,140 B1 * | 2/2006 | Waarts et al. ................. 372/21 |
| 2004/0252733 A1* | 12/2004 | Huang .......................... 372/22 |

FOREIGN PATENT DOCUMENTS

| JP | 05-053163 A | * | 3/1993 |
| JP | 07-028111 A | * | 1/1995 |
| JP | 09-283847 A | * | 10/1997 |
| JP | 2000-138405 A | * | 5/2000 |

* cited by examiner

*Primary Examiner*—James Menefee
(74) *Attorney, Agent, or Firm*—Jordan and Hamburg LLP

(57) ABSTRACT

A solid laser apparatus has a wavelength converter temperature controller 40 arranged for driving a Peltier device 41 to control the temperature Tc of a wavelength converter 5 so that the acceptable wavelength range of the wavelength converter 5 adapts to the wavelength range of reflected light from the grating part 6 at the temperature Ti and a laser controller 60 arranged for driving a semiconductor light amplifier device 1 to maintain the intensity of the extraordinary component passed through the polarizer 52 and measured by a photometer device 57.

7 Claims, 9 Drawing Sheets

SOLID LASER APPARATUS

FIELD OF THE INVENTION

The present invention relates to a solid laser apparatus and more particularly to a solid laser apparatus which can produce an output of harmonic light at stable level regardless of any change in the ambient temperature and can eliminate the occurrence of a state where the intensity of a desired output of light or linearly polarized light fails to be properly controlled.

BACKGROUND OF THE INVENTION

A semiconductor laser module is known which includes a combination of a laser diode and an optical fiber having a grating provided therein for stabilizing the wavelength of a laser output (See document 1 as an example).

Also, a technique is known for using a wavelength converter to carry out an action of wavelength conversion from a laser beam of which the wavelength has been fixed by a grating to harmonics (See document 2 as an example)

Moreover, a technique is known for modifying the temperature of a wavelength converter to produce an output of harmonic light at stable level regardless of changes in the ambient temperature and the wavelength of a laser diode (See document 3 as an example).

Moreover, a technique is known where the output of laser beam is controlled by adjusting a current for driving a semiconductor laser with a measurement, detected by a detector, of the intensity of a portion of harmonic light released from a wavelength converter and separated by a splitter (See document 3 as an example).

Document 1
Japanese Patent No. 3120828
Document 2
Japanese Patent No. 3223648
Document 3
Japanese Patent Laid-open Publication (Heisei) 5-53163
Document 4
Japanese Patent Laid-open Publication 2000-138405

(Problems that the Invention is to Solve)

It is assumed that the wavelength bandwidth of the fundamental wave of light released from an optical fiber having a grating part provided therein and received by a wavelength converter is 0.6 nm and the center wavelength $\lambda i$ of the released wavelength range is varied by $\delta \lambda i = 0.01$ nm/° C. depending on the temperature of the grating part.

Also, the acceptable wavelength bandwidth of the wavelength converter is 0.1 nm, and the center wavelength $\lambda c$ of the acceptable wavelength range is varied by $\delta \lambda c = 0.06$ nm/C.° depending on the temperature of the wavelength converter.

Accordingly, even if the center wavelength $\lambda i$ of the released wavelength range of the fundamental wave of light released from the optical fiber is equal to the center wavelength $\lambda c$ of the acceptable wavelength range of the wavelength converter when the temperature of the grating part and the temperature of the wavelength converter are at a reference temperature To, while the temperature of the grating part and the temperature of the wavelength converter are changed by $\Delta T$ in the ambient temperature change, the center wavelength $\lambda i$ of the released wavelength range of the fundamental wave of light released from the optical fiber is completely deviated from the center wavelength $\lambda c$ of the acceptable wavelength range of the wavelength converter, thus allowing no output of harmonic light.

$$\Delta T = \{(\text{released wavelength range of the grating part})/2 + (\text{acceptable wavelength range of the wavelength converter})/2\}/(\delta \lambda c - \delta \lambda i)$$

$$= \{(0.6/2) + (0.1/2)\}/(0.06 - 0.01)$$

$$= 7° \text{ C.}$$

However, none of the prior arts is successfully designed for overcoming the foregoing problem.

On the other hand, the inventors have developed a solid laser apparatus which produces a near ultraviolet ray or visible light by emitting laser light of red color to near infrared ray by a semiconductor laser, stabilizing in the wavelength by an optical fiber having a grating part provided therein and generating second harmonic of the fundamental wave of the laser light from the optical fiber by a wavelength converter which has a structure of periodically poled non-linear optical crystal. And in view of the demand for linearly polarized waves particularly in the measuring field or bio-engineering field, the second harmonic of linearly polarized light is created by setting the crystal axis and the direction of polarization of the wavelength converter to convert the extraordinary fundamental wave into the extraordinary second harmonic. Also, the intensity of output light is controlled by separating a portion of the harmonic light emitted from the wavelength converter by a splitter, measureing the intensity of the separeted light by the detector and modifying the current for driving the semiconductor laser with a measurement result.

However, the intensity of a desired output, that is, linearly polarized light may hardly be controlled depending on the wavelength of the fundamental wave.

It is hence an object of the present invention to provide a solid laser apparatus which can produce an output of harmonic light at stable level regardless of any change in the ambient temperature and can eliminate the occurrence of a state where the intensity of a desired output of light, that is, linearly polarized light fails to be properly controlled.

SUMMARY OF THE INVENTION

As a first aspect of the present invention, a solid laser apparatus is provided comprising a semiconductor light emitter, an optical fiber having a grating part provided therein, a wavelength converter for receiving an input of light from an optical resonator composed of the semiconductor light emitter and the optical fiber and releasing its harmonic, a first temperature detecting means for detecting the temperature Ti of the grating part, a second temperature detecting means for detecting the temperature Tc of the wavelength converter, and a wavelength converter temperature controlling means for controlling the temperature Tc with respect to the temperature Ti so that the acceptable wavelength range of the wavelength converter at the temperature Tc is matched with the wavelength range of the fundamental wave of light released from the optical fiber and received by the wavelength converter at the temperature Ti.

The solid laser apparatus according to the first aspect allows the acceptable wavelength range of the wavelength converter to be modified through controlling its temperature Tc in response to a change in the wavelength range of the fundamental wave of light released from the optical fiber and received by the wavelength converter which results from a change in the temperature Ti of the grating part.

Accordingly, the output of harmonic light can be stable regardless of any change in the ambient temperature.

As a second aspect of the present invention, the solid laser apparatus is modified in which assuming that the temperature coefficient of the wavelength of the fundamental wave of light released from the optical fiber and received by the wavelength converter is $\delta\lambda i$ nm/° C., the temperature coefficient of the acceptable wavelength of the wavelength converter is $\delta\lambda c$ nm/° C., the change in the temperature Tc is $\Delta$Tc ° C., and the change in the temperature Ti is $\Delta$Ti ° C., the wavelength converter temperature controlling means carries out an action of temperature control so as to establish $$\Delta Tc=(\delta\lambda i/\delta\lambda c)\times\Delta Ti$$

or $$\Delta Tc\approx(\delta\lambda i/\delta\lambda c)\times\Delta Ti.$$

When the change in the temperature of the wavelength converter is $\Delta$Tc and the change in the temperature of the grating part is $\Delta$Ti, the acceptable wavelength range of the wavelength converter is varied by $\delta\lambda c\times\Delta Tc$ with the wavelength range of the fundamental wave of light released from the optical fiber and received by the wavelength converter being varied by $\delta\lambda i\times\Delta Ti$. However, the solid laser apparatus according to the second aspect provides $\Delta Tc=(\delta\lambda i/\delta\lambda c)\times\Delta Ti$ or $\Delta Tc\approx(\delta\lambda i/\delta\lambda c)\times\Delta Ti$. Accordingly, $\delta\lambda c\times\Delta Tc=\delta\lambda i\times\Delta Ti$ or $\delta\lambda c\times\Delta Tc\approx\delta\lambda i\times\Delta Ti$ is then given. More particularly, the two wavelength ranges can be matched each other in the change precisely or substantially. As a result, the output of harmonic light can be stable regardless of any change in the ambient temperature.

As a third aspect of the present invention, the solid laser apparatus is modified in which when the temperature coefficient of the wavelength of the fundamental wave of light released from the optical fiber and received by the wavelength converter is $\delta\lambda i=0.01$ nm/° C., the temperature coefficient of the acceptable wavelength of the wavelength converter is $\delta\lambda c=0.06$ nm/° C., the change in the temperature Tc is $\Delta$Tc ° C., and the change in the temperature Ti is $\Delta$Ti ° C., and k=0.1 to 0.2, the wavelength converter temperature controlling means carries out an action of temperature control so as to establish $$\Delta Tc=k\times\Delta Ti.$$

When the change in the temperature of the wavelength converter is $\Delta$Tc and the change in the temperature of the grating part is $\Delta$Ti, the acceptable wavelength range of the wavelength converter is varied by $0.06\times\Delta Tc$ with the wavelength range of the fundamental wave of light released from the optical fiber and received by the wavelength converter being varied by $0.01\times\Delta Ti$. However, the solid laser apparatus according to the third aspect provides $\Delta Tc=(0.1$ to $0.2)\times\Delta Ti$. Accordingly, $0.06\times\Delta Tc=0.06\times(0.1$ to $0.2)\times\Delta Ti=(0.006$ to $0.012)\times\Delta Ti$ is then given. More particularly, the two wavelength ranges can be matched each other in the change precisely or substantially. As a result, the output of harmonic light can be stable regardless of any change in the ambient temperature.

As a fourth aspect of the present invention, a solid laser apparatus is provided comprising a semiconductor light emitter, an optical fiber having a grating part provided therein, a wavelength converter having a structure of periodically poled non-linear optical crystal for receiving an input of light from an optical resonator composed of the semiconductor light emitter and the optical fiber and releasing its harmonic light, a polarizer for passing an extraordinary component of the harmonic light, an optical separating means for separating a portion of the extraordinary component passed through the polarizer, a light measuring means for measuring the intensity of the separated portion of the extraordinary component of the light, and a controlling means for driving the semiconductor light emitter in response to a measurement of the light measuring means so as to maintain the intensity of the separated portion of the extraordinary component of the light at a predetermined level.

It is found through a series of studies by the inventors of this application that the wavelength converter having a structure of periodically poled non-linear optical crystal enables to generate the second harmonic of ordinary light as well as the second harmonic of extraordinary light at one time. This will be explained below in more detail.

The periodically poled structure is a structure where the spontaneous polarization of a crystalline material is inverted at regular intervals for satisfying its quasi phase matching condition (See "Phys. Rev. 127 by J. A. Armstrong et al, p1918, 1962" and "Solid Physics 29, No. 1, by Kurimura, p75, 1994").

The quasi phase matching condition means a polarization inversion intervals $\Lambda$ expressed by $$\Lambda=2m\times\lambda/4\{n(2\omega)-n(\omega)\} \quad (1)$$

where m=1, 2, 3, . . . , n($\omega$) is the refractive index of the fundamental wave, and n(2$\omega$) is the refractive index of the second harmonic light.

In general, as the conversion efficiency is proportional to $(1/m)^2$, m=1 is given. For converting the fundamental wave TE($\omega$) of extraordinary light transmitted at the TE mode into a second harmonic wave TE(2$\omega$) at the TE mode, the refractive indices for the extraordinary light are expressed by ne($\omega$) and ne(2$\omega$) from n($\omega$) and n(2$\omega$).

This conversion of wavelength is illustrated as (a) in FIG. 8 showing the relation between the wavelength $\lambda$ of the fundamental wave TE($\omega$) and the polarization inversion interval $\Lambda$ satisfying the quasi phase matching condition. It is noted that the wavelength converter having a structure of MgO:LiNbO$_3$ inverted at periodic intervals in the polarization is employed.

Also, for converting the fundamental wave TE($\omega$) of extraordinary light transmitted at the TE mode into a second harmonic wave TM(2$\omega$) of ordinary light transmitted at the TM mode under m=1, the refractive indices for the extraordinary light and the second harmonic of the ordinary light are used as ne($\omega$) and no(2$\omega$), and $\Lambda$ is calculated from Equation (1) using m=1, ne($\omega$) and no(2$\omega$).

This $\Lambda$ is illustrated as (b) in FIG. 8 showing the relation between the wavelength $\lambda$ of the fundamental wave TE($\omega$) and the polarization inversion interval $\Lambda$ satisfying the quasi phase matching condition.

Moreover, for converting the fundamental wave TE($\omega$) of extraordinary light transmitted at the TE mode into a second harmonic wave TM(2$\omega$) of ordinary light transmitted at the TM mode under m=2, the refractive indices for the extraordinary light and the second harmonic of ordinary light are used as ne($\omega$) and no(2$\omega$), and $\Lambda$ is calculated from Equation (1) using m=2, ne($\omega$) and no(2$\omega$).

This conversion of wavelength is illustrated as (c) in FIG. 8 showing the relation between the wavelength $\lambda$ of the fundamental wave TE($\omega$) and the polarization inversion interval $\Lambda$ satisfying the quasi phase matching condition.

As apparent from the relationships of FIG. 8, a point P where the two profiles (a) and (c) intersect each other exists about 5.3 μm of the polarization inversion interval $\Lambda$ of the wavelength converter and 980 nm of the wavelength λ of the fundamental wave TE(ω). This means that the fundamental wave TE(ω) of extraordinary light transmitted at the TE mode has been converted into a second harmonic wave TE(2ω) of extraordinary light at m=1 and simultaneously into a second harmonic wave TM(2ω) of ordinary light at m=2.

When the ratio (duty ratio) in the length along the optical axis between polarization inverted region and not inverted region in the polarization inversion interval is 1 at m=2 in the quasi phase matching, the second harmonic may not be generated (See the above reference "Solid Physics by Kurimura"). The described phenomenon however occurs as it is impractical to have the structure inverted at intervals in the polarization with the duty ratio being 1.

Also, the point P may be dislocated more or less because of small variations in the refractive index of the wavelength converter and in the uniformity of the waveguide construction at the polarization inversion interval. Furthermore, they may be shifted by the effect of a change in the temperature of the wavelength converter.

It is also found through a series of studies by the inventors that a change in the extraordinary component is not equal to a change in the ordinary component in the output of laser beam when the temperature of the wavelength converter is varied. This will now be explained.

As shown in FIG. 9, the extraordinary component P(2ωe) in the output light of 490 nm converted from 980 nm of the wavelength exhibits a profile of change having the peak about 24° C. On the other hand, the ordinary component P(2ωo) in the output light is declined as the temperature increases.

More specifically, it is found that a change in the temperature of the wavelength converter causes not only a variation in the intensity of both the extraordinary and ordinary components but also a change in the ratio of polarization or of energy between the extraordinary component and the ordinary component.

It is true that the beam splitter has polarization dependence and will change its ratio of the intensity between reflected light and transmitted light when the polarization ratio is varied. This permits no proper action of controlling the output of light based on the reflected light.

In the action of separating a portion of the output light being separated by an optical divider such as a beam splitter, measuring its intensity by a detector, and modifying the current for driving a semiconductor laser with the measurement to control the output of laser light, the ordinary component in the output light which contains extraordinary component and ordinary component will give an adverse effect when the polarization inversion interval Λ of a wavelength converter is about 5.3 μm and the wavelength of the fundamental wave of the light is about 980 nm, in an example shown in FIGS. 8 and 9, hence disallowing controlling of the intensity of the extraordinary light as the target output light to a uniform level.

The solid laser apparatus according to the fourth aspect is featured in that while the extraordinary component of second harmonic light released from the wavelength converter is passed through the polarizer for output, its portion is separated, measured, and used for controlling the intensity of the output. Accordingly, even when the wavelength converter releases the extraordinary component together with an ordinary component, the output of the extraordinary component as a desired light output can be protected from its intensity being out of control.

As a fifth aspect of the present invention, the solid laser apparatus further comprises a beam shaping prism for shaping the beam shape of the harmonic light released from the wavelength converter, wherein the beam shaping prism is constructed integral with the polarizer.

The polarizer and the beam shaping prism in the solid laser apparatus according to the fifth aspect may be implemented in an integral arrangement by coating the sloped side of the bean shaping prism with a polarizing layer. This allows the construction to be simpler than the polarizer and the beam shaping prism provided separately.

As a sixth aspect of the present invention, a solid laser apparatus is provided comprising a semiconductor light emitter, an optical fiber having a grating part provided therein, a wavelength converter having a structure of periodically poled non-linear optical crystal for receiving an input of light from an optical resonator composed of the semiconductor light emitter and the optical fiber and releasing its harmonic light, an optical separating means for separating a portion of the harmonic light, a polarizer for passing an extraordinary component of the separated harmonic light, a light measuring means for measuring the intensity of the extraordinary component of the light, and a controlling means for driving the semiconductor light emitter in response to a measurement of the light measuring means so as to maintain the intensity of the extraordinary component of the light at a predetermined level.

The solid laser apparatus according to the sixth aspect allows the extraordinary component of second harmonic light released from the wavelength converter to be passed through the polarizer while its intensity is measured for controlling the output. Accordingly, even when the wavelength converter releases both the extraordinary component and the ordinary component, the output of the extraordinary component as a desired light output can be protected from its intensity being out of control.

ADVANTAGE OF THE INVENTION

As set forth above, the wavelength converting laser apparatus according to the present invention allows the temperature Tc of the wavelength converter to be controlled with respect to the temperature Ti so that the acceptable wavelength range of the wavelength converter at the temperature Tc remains matched with the wavelength range of reflected light from the grating part at the temperature Ti. As a result, the output of harmonic light can be stable regardless of any change in the ambient temperature.

Also, the wavelength converting laser apparatus according to the present invention when the output of harmonic light from its wavelength converter contains an extraordinary component and an ordinary component allows the extraordinary component required particularly in the bioengineering or measuring field of industry to be properly controlled in the intensity of laser output.

BEST MODES FOR EMBODYING THE INVENTION

Preferred embodiments of the present invention will now be described referring to the relevant drawings. It would be understood that the present invention is not limited to the described embodiments.

(First Embodiment)

Figure 1:
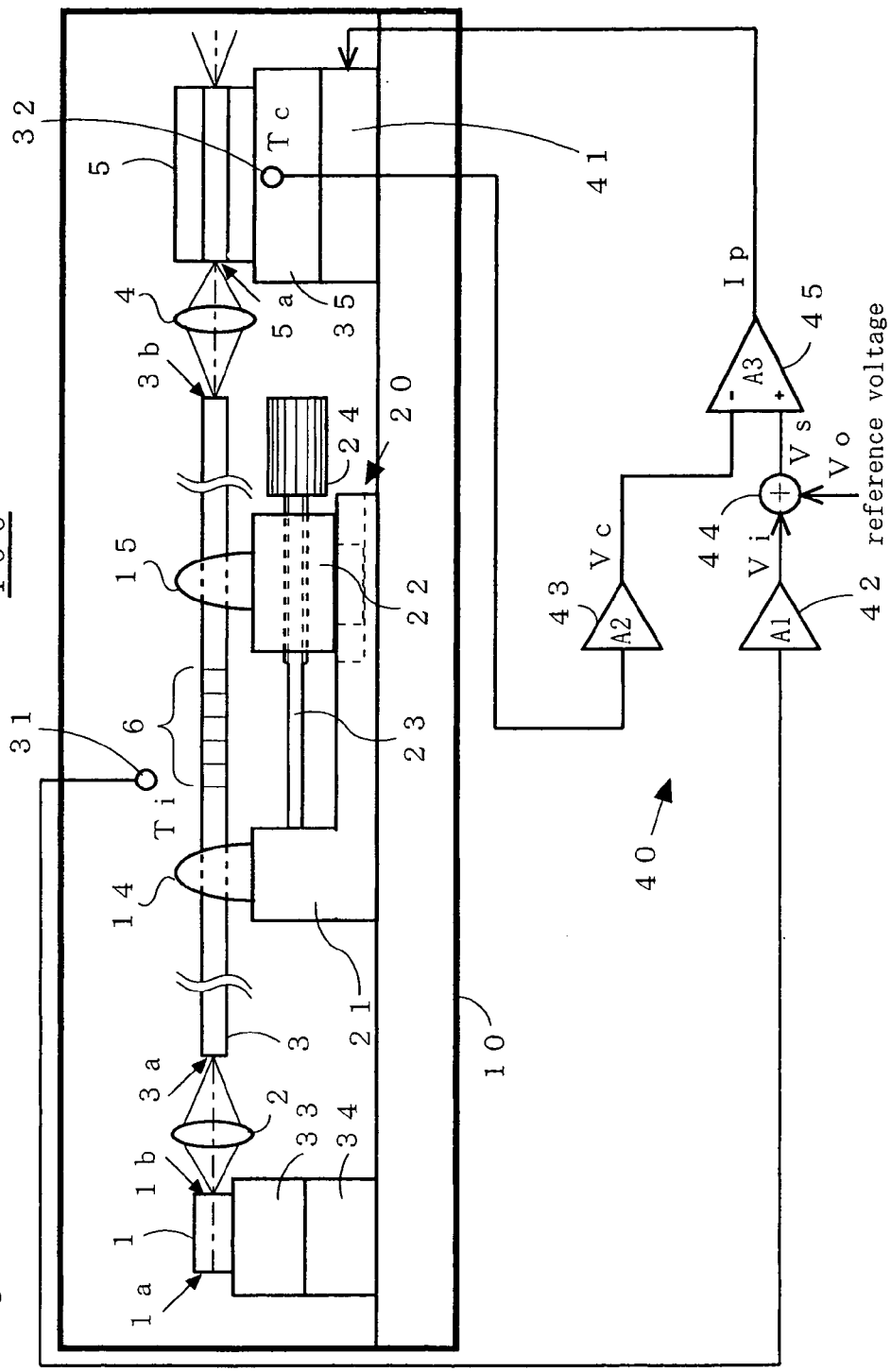
FIG. 1 is a schematic illustrative view of a wavelength converting laser apparatus showing a first embodiment of the present invention.

FIG. 1 is a schematic illustrative view of a wavelength converting laser apparatus 100 showing a first embodiment of the present invention.

The wavelength converting laser apparatus 100 comprises a semiconductor light amplifier device 1 for generating a beam of laser through feeding the area defined by a light reflecting side 1a and a light output side 1b with current, a mounting base 33 on which the semiconductor light amplifier device 1 is mounted, a Peltier device 34 for controlling the temperature of the semiconductor light amplifier device 1 through the mounting base 33, a lens 2 for collecting the laser beam generated by the semiconductor light amplifier device 1, an optical fiber 3 having a grating part 6 provided therein, a lens 4 for collecting the light released from the optical fiber 3, a wavelength converter 5 for releasing a second harmonic of the input light through the lens 4, a mounting base 35 on which the wavelength converter 5 is mounted, a Peltier device 41 for controlling the temperature of the wavelength converter 5 through the mounting base 35, a grating part expander mechanism 20 holding the optical fiber 3 at two locations, a first holder 14 and a second holder 15, between which the grating part 6 is present, a housing 10 for accommodating those components, a temperature sensitive device 31 for measuring the temperature Ti of the grating part 6, a temperature sensitive device 32 for measuring the temperature Tc of the wavelength converter 5, and a wavelength converter temperature controller 40 for controlling the temperature Tc of the wavelength converter 5 with respect to the temperature Ti so that the wavelength range of the light received by the wavelength converter 5 is matched with the acceptable wavelength range of the wavelength converter 5.

The semiconductor light amplifier device 1 generates and amplifies, for example, a range of laser beam from 900 nm to 1100 nm in the wavelength. The light reflecting side 1a is provided with a coating for having a high level of the reflectivity while the light output side 1b is provided with a coating for having a low level of the reflectivity.

The incident end 3a of the optical fiber 3 is preferably configured to a taper or wedge shape for receiving more of the light from semiconductor light amplifier device 1. This may allow no use of the lens 2.

The grating part 6 is arranged for changing the refractive index at regular intervals in a predetermined region of the optical fiber 3. It is, for example, fabricated by an ultraviolet laser beam emitted from, e.g., an excimer laser being divided into two lights by abeam splitter, passed through different light paths, and overlapped each other over an optical fiber to generate a pattern of interference, so that the refractive index is varied at regular intervals equal to the pattern of interference caused by a photo refractive action of the optical fiber corresponding to the intensity of the ultraviolet light. The wavelength range, the center wavelength, and the reflectivity can arbitrarily be determined by adjusting the intervals and the length of the grating part to proper settings.

The grating part 6 reflects a predetermined wavelength range, e.g. 0.6 nm in width, of light of which the center wavelength λi is between 900 nm and 1100 nm.

The grating part expander mechanism 20 comprises a base 21, a movable nut 22 arranged slidable over and along the base 21, a lead screw 23 on which the movable nut 22 is threaded, and an operating unit 24 for turning the lead screw 23 with the use of a hand or a tool. The first holder 14 is mounted to the base 21 while the second holder 15 is mounted to the movable nut 22. The first holder 14 and the second holder 15 are securely joined to the optical fiber 3 by adhesive bonding or soldering.

When the lead screw 23 is turned by operating the operating unit 24, the movable nut 22 slides on and along the base 21 to vary the distance between the first holder 14 and the second holder 15. This causes the grating part 6 to extend or retract thus changing the intervals at which the refractive index is varied. As a result, the light transmitted from the optical fiber 3 to the wavelength converter 5 can favorably be modified in the center wavelength λi.

The semiconductor light amplifier device 1 and the grating part 6 constitute an optical resonator. In action, the light released from the semiconductor light amplifier device 1 is focused by the lens 2 and transmitted to the incident end 3a of the optical fiber 3. The light received by the optical fiber 3 is reflected at a predetermined wavelength range by the grating part 6 and returned back to the semiconductor light amplifier device 1 where it is amplified again. The amplified light is released from the semiconductor light amplifier device 1 and received by the optical fiber 3. By repeating this action, a desired wavelength range of the light determined by the grating part 6 can be released from the output end 3b of the optical fiber 3.

The desired wavelength light released from the output end 3b of the optical fiber 3 is then focused by the lens 4 on one end 5a of the wavelength converter 5. The lens 4 is provided with a non-reflection coating.

The wavelength converter 5 may be made of a material selected from $LiNbO_3$, $LiTaO_3$, $MgO:LiNbO_3$, $MgO:LiTaO_3$, $KNbO_3$, and $KTiOPO_4$ or its periodically polarization inverted form provided with an optical waveguide. When receiving a light beam of 900 nm to 1100 nm in the wavelength, the wavelength converter 5 releases its second harmonic of which the wavelength is from 450 nm to 550 nm.

Although the temperature measured by the temperature sensitive device 31 is actually a measurement adjacent to the grating part 6 in the housing 10, it is referred to as the temperature Ti of the grating part 6.

Similarly, although the temperature measured by the temperature sensitive device 32 is actually a measurement on the mounting base 35, it is referred to as the temperature Tc of the wavelength converter 5.

The two temperature sensitive devices 31 and 32 may be implemented by thermistors.

The wavelength converter temperature controller 40 comprises a Peltier device 41, a converter circuit 42 for converting the temperature Ti of the grating part 6 into a voltage Vi, a converter circuit 43 for converting the temperature Tc of the wavelength converter 5 into a voltage Vc, an adder circuit 44 for summing the voltage Vi and the reference voltage Vo to have the sum voltage released as Vs, and a driver circuit 45 for generating a drive current Ip for driving the Peltier device 41 from a difference between the voltage Vs and the voltage Vc.

The above outputs are then expressed by:

$$Vi = A1 \cdot Ti \quad (1)$$

$$Vc = A2 \cdot Tc \quad (2)$$

$$Vs = Vi + Vo \quad (3)$$

$$Ip = A3 \cdot (Vs - Vc) \quad (4)$$

where A1, A2, and A3 are conversion coefficients.

When the center wavelength $\lambda io$ of the wavelength range of the fundamental wave of light released from the optical fiber 3 and received by the wavelength converter 5 is identical to the center wavelength $\lambda co$ of the acceptable wavelength range controlled by the wavelength converter 5 with both the temperature Ti of the grating part 6 and the temperature Tc of the wavelength converter 5 being equal to the reference temperature To, Ti=Tc=To and Ip=0 are given in the equations (1) to (4). Then, established is $$0 = A3 \cdot (A1 \cdot To + Vo - A2 \cdot To) \quad (5)$$

Figure 2:
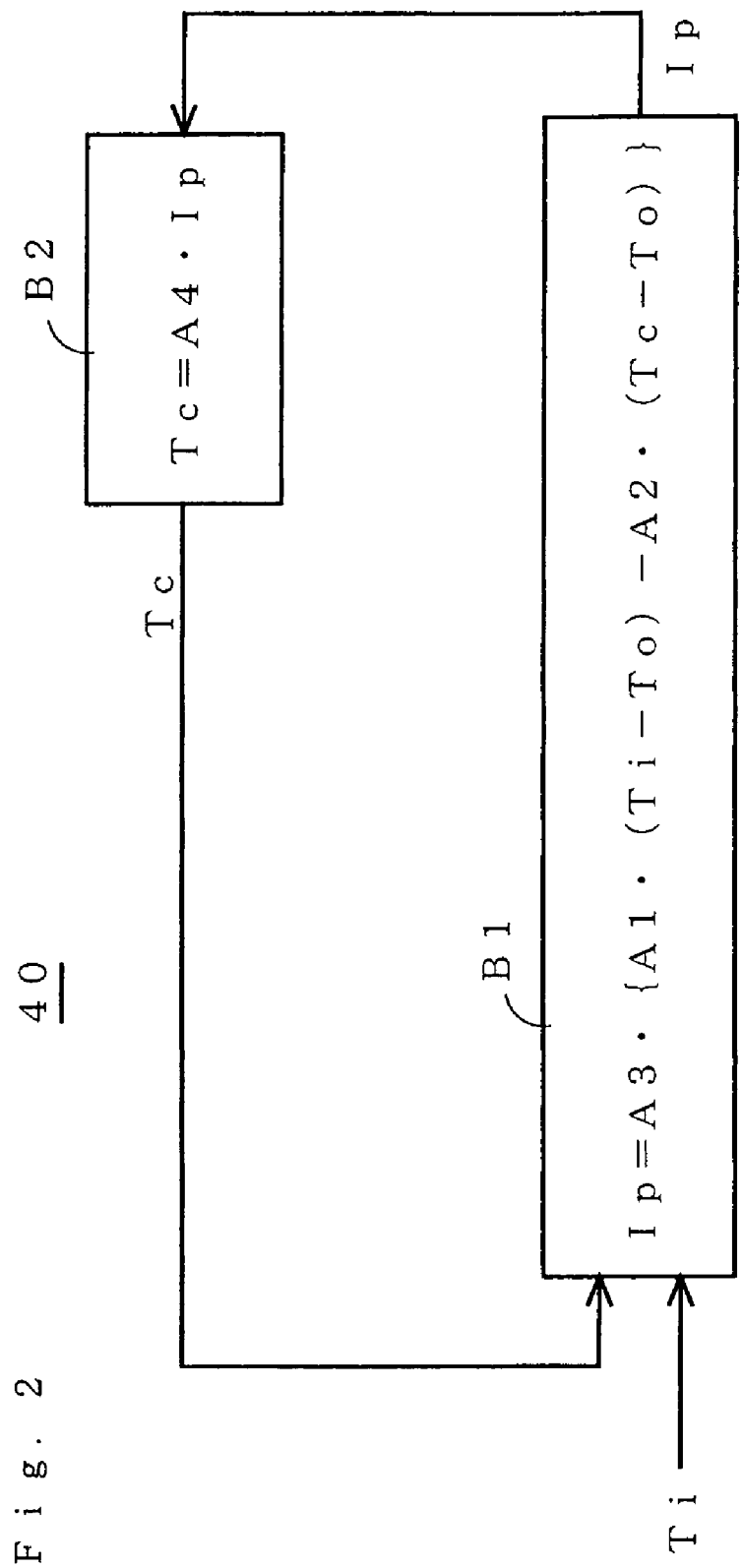
FIG. 2 is a block diagram of a control loop in a wavelength converter temperature controller of the embodiment.

FIG. 2 is a block diagram of a control loop in the wavelength converter temperature controller 40.

A block B1 represents the conversion function for the converter circuit 42, the converter circuit 43, the adder circuit 44, and the driver circuit 45. This function can be determined from the equations (1) to (5).

A block B2 represents the current-to-temperature conversion function for the Peltier device 41. This current-to-temperature conversion function is expressed by:

$$Tc = A4 \cdot Ip \quad (6)$$

where A4 is a conversion coefficient.

Then, the equation (7) is determined from the equations (1) to (6).

$$\Delta Tc = k \cdot \Delta Ti \quad (7)$$

where $$\Delta Tc = Tc - To \quad (8)$$

$$\Delta Ti = Ti - To \quad (9)$$

$$k = A1 \cdot A3 \cdot A4 / (1 + A2 \cdot A3 \cdot A4) \quad (10)$$

Assuming that the temperature coefficient of the wavelength of the fundamental wave of light released from the optical fiber 3 and received by the wavelength converter 5 is $\delta\lambda i$ nm/° C. and the temperature coefficient of the acceptable wavelength of the wavelength converter 5 is $\delta\lambda c$ nm/° C., the conversion coefficients A1 to A4 are determined so as to establish $$k = \delta\lambda i / \delta\lambda c$$

or $$k \approx \delta\lambda i / \delta\lambda c$$

For example, when $\delta\lambda i = 0.1$ nm/C.° and $\delta\lambda c = 0.06$ nm/C.°, the conversion coefficients A1 to A4 are determined so as to establish $$k = \frac{1}{6}$$

or $$k = 0.1 \text{ to } 0.2.$$

Figure 3:
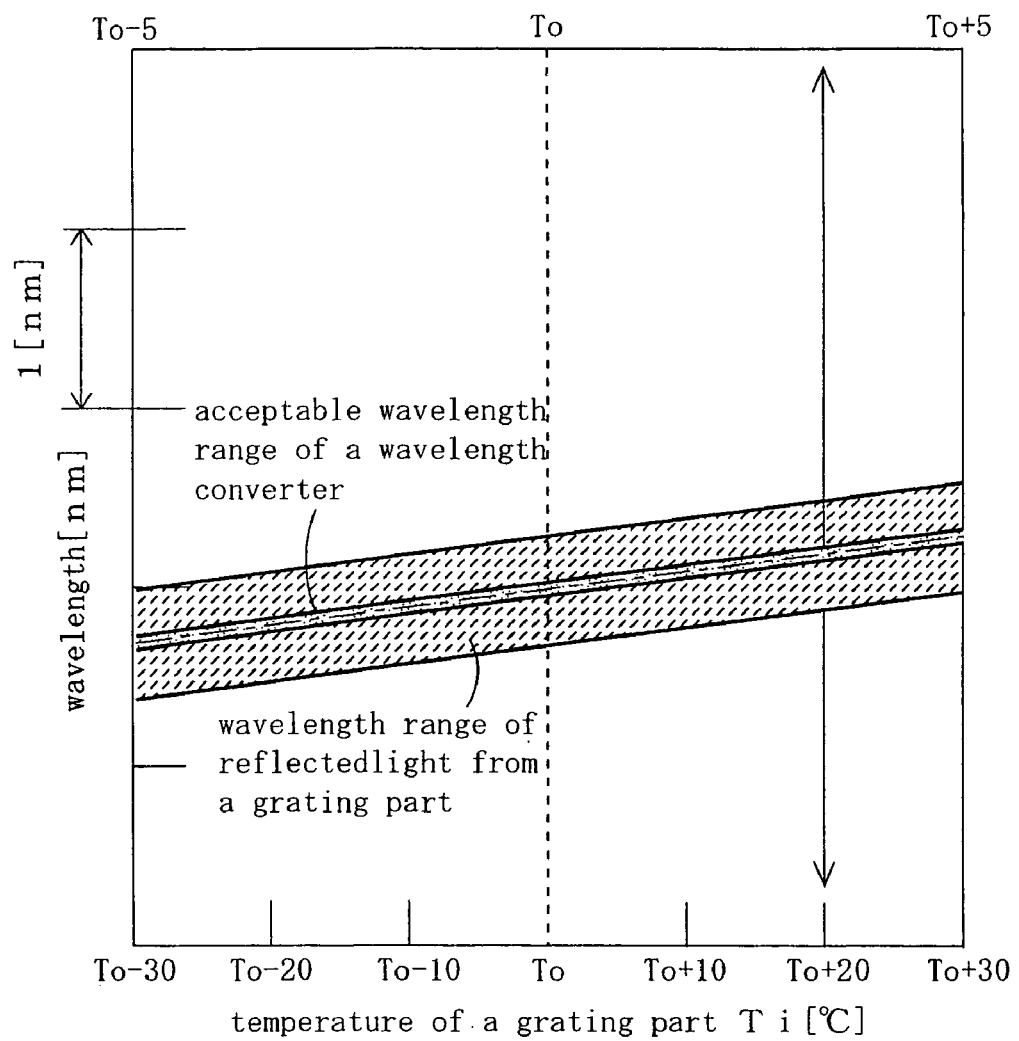
FIG. 3 illustrates a temperature profile in the wavelength range of reflected light from a grating part and a temperature profile in the acceptable wavelength range of a wavelength converter when controlled in the temperature at k=⅙.

FIG. 3 illustrates a temperature profile in the wavelength range of reflected light from the grating part 6 (i.e. the wavelength range of the fundamental wave of light released from the optical fiber 3 and received by the wavelength converter 5) and a temperature profile in the acceptable wavelength range of the wavelength converter 5 when controlled in the temperature at $k=\frac{1}{6}$.

In the profiles, the temperature coefficient $\delta\lambda i$ and the width of the wavelength range of reflected light from the grating part 6 are 0.01 nm/° C. and 0.6 nm respectively while the temperature coefficient $\delta\lambda c$ and the width of the acceptable wavelength range of the wavelength converter 5 are 0.06 nm/° C. and 0.1 nm respectively.

As apparent from FIG. 3, the temperature Tc is controlled with respect to the temperature Ti. Accordingly, the acceptable wavelength range of the wavelength converter 5 at the temperature Tc can consistently be matched with the wavelength range of reflected light from the grating part 6 at the temperature Ti.

Comparison

Figure 4:
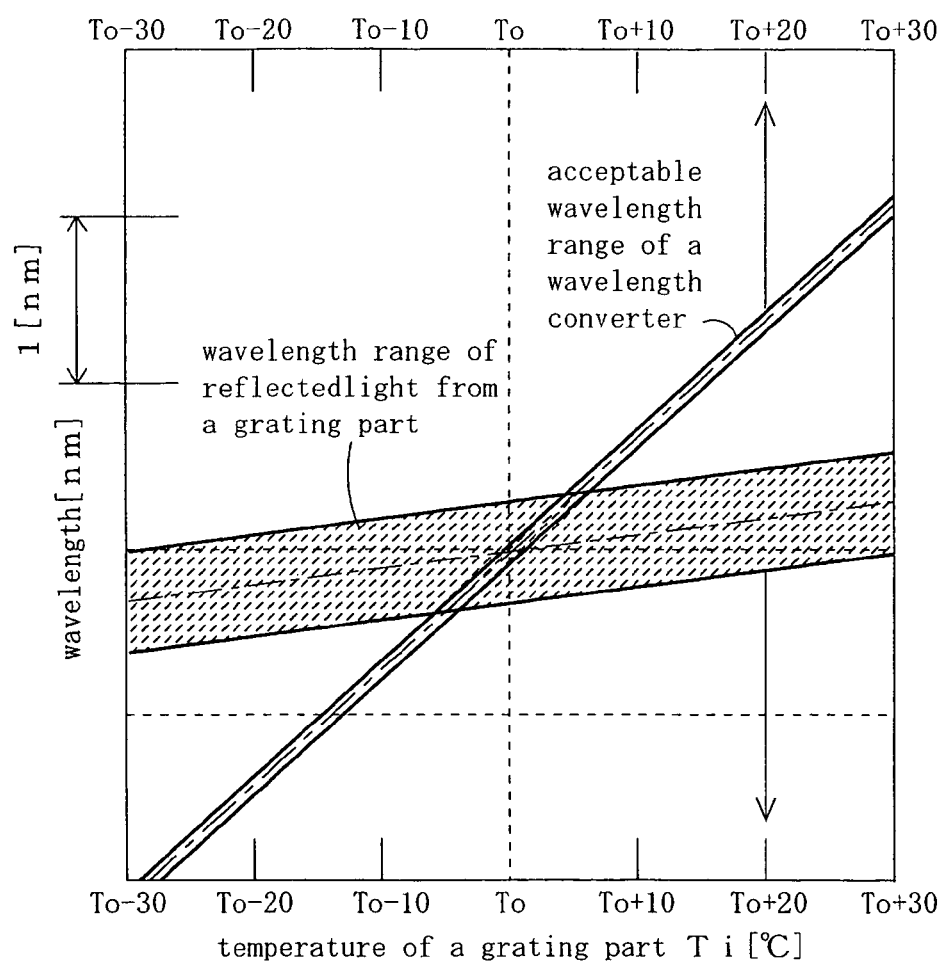
FIG. 4 illustrates a temperature profile in the wavelength range of reflected light from the grating part and a temperature profile in the acceptable wavelength range of the wavelength converter when not controlled in the temperature.

FIG. 4 illustrates a temperature profile in the wavelength range of reflected light from the grating part 6 and a temperature profile in the acceptable wavelength range of the wavelength converter 5 when not controlled in the temperature (i.e., when remaining at Ti=Tc).

Similarly in the comparison, the temperature coefficient $\delta\lambda i$ and the width of the wavelength range of reflected light from the grating part 6 are 0.01 nm/° C. and 0.6 nm respectively while the temperature coefficient $\delta\lambda c$ and the width of the acceptable wavelength range of the wavelength converter 5 are 0.06 nm/° C. and 0.1 nm respectively.

As apparent from FIG. 4, the acceptable wavelength range of the wavelength converter 5 will hardly be matched with the wavelength range of reflected light from the grating part 6 at its temperature Ti being equal to Tc but different from the reference temperature To.

(Second Embodiment)

Figure 5:
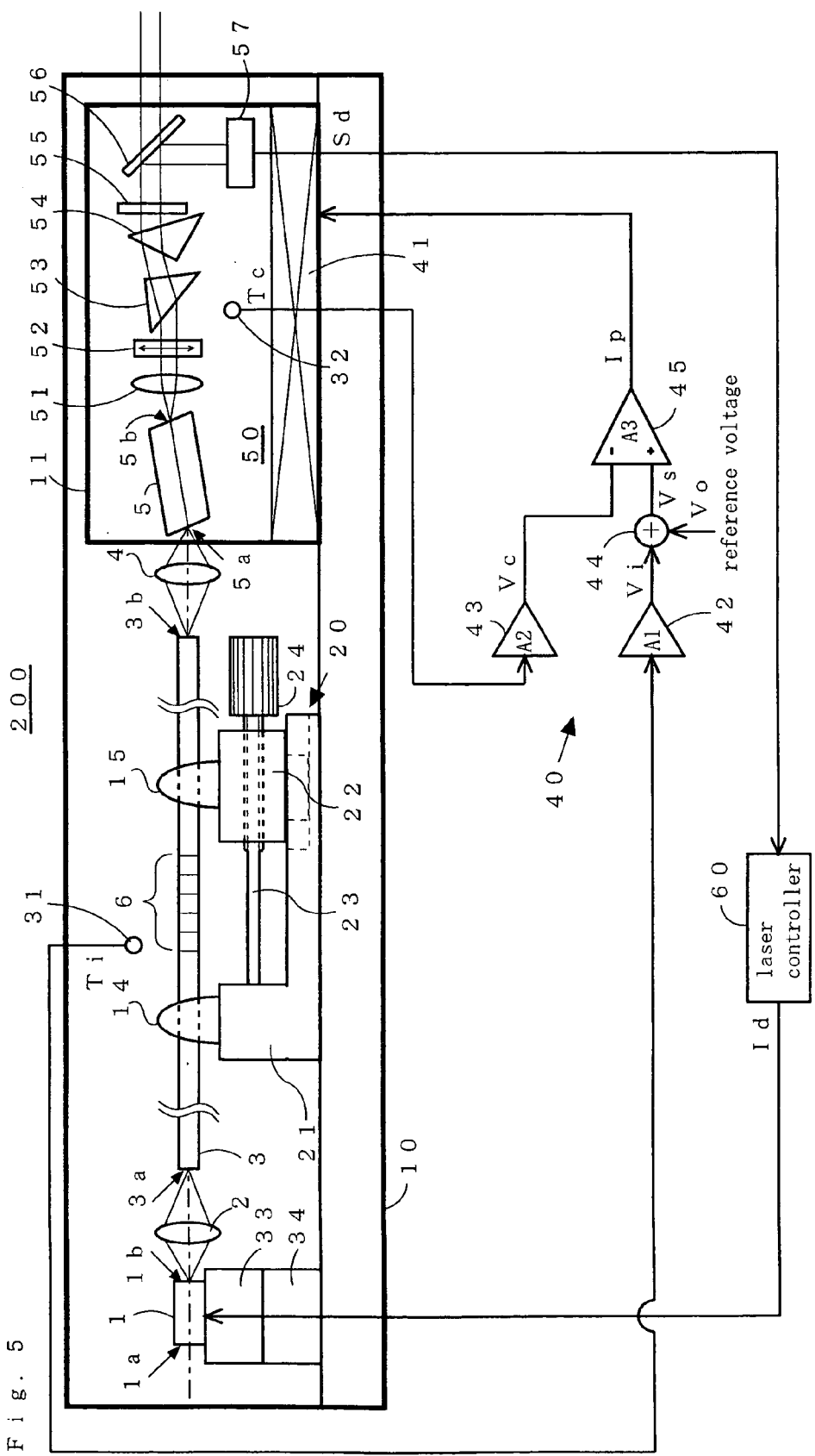
FIG. 5 is a schematic illustrative view of a wavelength converting laser apparatus 200 showing a second embodiment of the present invention.

FIG. 5 is a schematic illustrative view of a wavelength converting laser apparatus 200 showing a second embodiment of the present invention.

The wavelength converting laser apparatus 200 comprises a semiconductor light amplifier device 1 for generating and amplifying a beam of laser through feeding an area defined by a light reflecting side 1*a* and a light output side 1*b* with a current, a mounting base 33 on which the semiconductor light amplifier device 1 is mounted, a Peltier device 34 for controlling the temperature of the semiconductor light amplifier device 1 through the mounting base 33, a lens 2 for collecting the laser beam generated by the semiconductor light amplifier device 1, an optical fiber 3 having a grating part 6 provided therein, a lens 4 for collecting the light released from the optical fiber 3, a wavelength converter unit 50 equipped with a wavelength converter 5 for releasing a second harmonic of the input light received through the lens 4, a grating part expander mechanism 20 holding the optical fiber 3 at two locations, a first holder 14 and a second holder 15, between which the grating part 6 is present, a housing 10 for accommodating those components, a temperature sensitive device 31 for measuring the temperature Ti of the grating part 6, a temperature sensitive device 32 for measuring the temperature Tc in the wavelength converter unit 50, a temperature controller 40 for controlling the temperature Tc with respect to the temperature Ti so that the acceptable wavelength range of the wavelength converter unit 50 is matched with the wavelength range of light received by the wavelength converter unit 50, and a laser controller 60.

The semiconductor light amplifier device 1 generates and amplifies, for example, a range of laser beam from 975 nm to 1015 nm in the wavelength. The light reflecting side 1a is provided with a coating for having a high level of the reflectivity while the light output side 1b is provided with a coating for having a low level of the reflectivity.

The incident end 3a of the optical fiber 3 is preferably configured to a taper or wedge shape for receiving more of the light from semiconductor light amplifier device 1. This may allow no use of the lens 2.

The grating part 6 is arranged for changing the refractive index at regular intervals in a predetermined region of the optical fiber 3. It is, for example, fabricated by an ultraviolet laser beam emitted from, e.g., an excimer laser being divided into two lights by a beam splitter, passed through different light paths, and overlapped each other over an optical fiber to generate a pattern of interference, so that the refractive index is varied at regular intervals equal to the pattern of interference caused by a photo refractive action of the optical fiber corresponding to the intensity of the ultraviolet light. The wavelength range, the center wavelength, and the reflectivity can arbitrarily be determined by adjusting the intervals and the length of the grating part 6 to proper settings.

The grating part 6 may be arranged for reflecting the light of a predetermined wavelength range, e.g. 0.5 nm, of which the center wavelength λi is between 975 nm and 1015 nm. The wavelength range is determined by the length of the grating part 6 while the center wavelength λi is adjustable with the grating part expander mechanism 20 controlling the intervals of changing the refractive index.

The grating part expander mechanism 20 comprises a base 21, a movable nut 22 arranged slidable over and along the base 21, a lead screw 23 on which the movable nut 22 is threaded, and an operating unit 24 for turning the lead screw 23 with the use of a hand or a tool. The first holder 14 is mounted to the base 21 while the second holder 15 is mounted to the movable nut 22. The first holder 14 and the second holder 15 are securely joined to the optical fiber 3 by adhesive bonding or soldering.

When the lead screw 23 is turned by operating the operating unit 24, the movable nut 22 slides on and along the base 21 to vary the distance between the first holder 14 and the second holder 15. This causes the grating part 6 to extend or retract thus changing the intervals at which the refractive index is varied. As a result, the light transmitted from the optical fiber 3 to the wavelength converter 5 can be matched with the acceptable wavelength range of the wavelength converter 5.

The semiconductor light amplifier device 1 and the grating part 6 constitute an optical resonator. Inaction, the light released from the semiconductor light amplifier device 1 is focused by the lens 2 and transmitted to the incident end 3a of the optical fiber 3. The light received by the optical fiber 3 is reflected at the wavelength range determined by the grating part 6 and returned back to the semiconductor light amplifier device 1 where it is amplified again. The amplified light is released from the semiconductor light amplifier device 1 and received by the optical fiber 3. By repeating this action, a desired wavelength range of the light determined by the grating part 6 can be released from the output end 3b of the optical fiber 3. The output end 3b is beveled at an angle, e.g. eight degrees, for inhibiting the return of light. Also, the output end 3b of the optical fiber 3 is preferably coated with a non-reflecting layer.

The desired wavelength light released from the output end 3b of the optical fiber 3 is then focused by the lens 4 on one end 5a of the wavelength converter 5. The lens 4 is provided with a non-reflection coating.

The wavelength converter 5 may be made of a material selected from $LiNbO_3$, $LiTaO_3$, $MgO:LiNbO_3$, $MgO:LiTaO_3$, $KNbO_3$, and $KTiOPO_4$ or its periodically polarization inverted form provided with an optical waveguide. When receiving a light beam of 975 nm to 1015 nm in the wavelength, the wavelength converter 5 releases its second harmonic of which the wavelength is from 487.5 nm to 507.5 nm.

Although the temperature measured by the temperature sensitive device 31 is actually a measurement adjacent to the grating part 6 in the housing 10, it is referred to as the temperature Ti of the grating part 6.

Similarly, although the temperature measured by the temperature sensitive device 32 is actually a measurement of the temperature in the internal space of the wavelength converter unit 50, it is referred to as the temperature Tc of the wavelength converter 5.

The two temperature sensitive devices 31 and 32 may be implemented by thermistors.

The wavelength converter temperature controller 40 comprises a Peltier device 41, a converter circuit 42 for converting the temperature Ti of the grating part 6 into a voltage Vi, a converter circuit 43 for converting the temperature Tc of the wavelength converter 5 into a voltage Vc, an adder circuit 44 for summing the voltage Vi and the reference voltage Vo to have the sum voltage released as Vs, and a driver circuit 45 for generating a drive current Ip for driving the Peltier device 41 from a difference between the voltage Vs and the voltage Vc.

The above outputs are then expressed by:

$$Vi = A1 \cdot Ti \quad (2)$$

$$Vc = A2 \cdot Tc \quad (3)$$

$$Vs = Vi + Vo \quad (4)$$

$$Ip = A3 \cdot (Vs - Vc) \quad (5)$$

where A1, A2, and A3 are conversion coefficients.

When the center wavelength λio of the wavelength range of the fundamental wave of light released from the optical fiber 3 and received by the wavelength converter 5 is identical to the center wavelength λco of the acceptable wavelength range controlled by the wavelength converter 5 with both the temperature Ti of the grating part 6 and the temperature Tc of the wavelength converter 5 being equal to the reference temperature To, Ti=Tc=To and Ip=0 are given in the equations (2) to (5). Then, established is $$0 = A3 \cdot (A1 \cdot To + Vo - A2 \cdot To) \tag{6}$$

Figure 6:
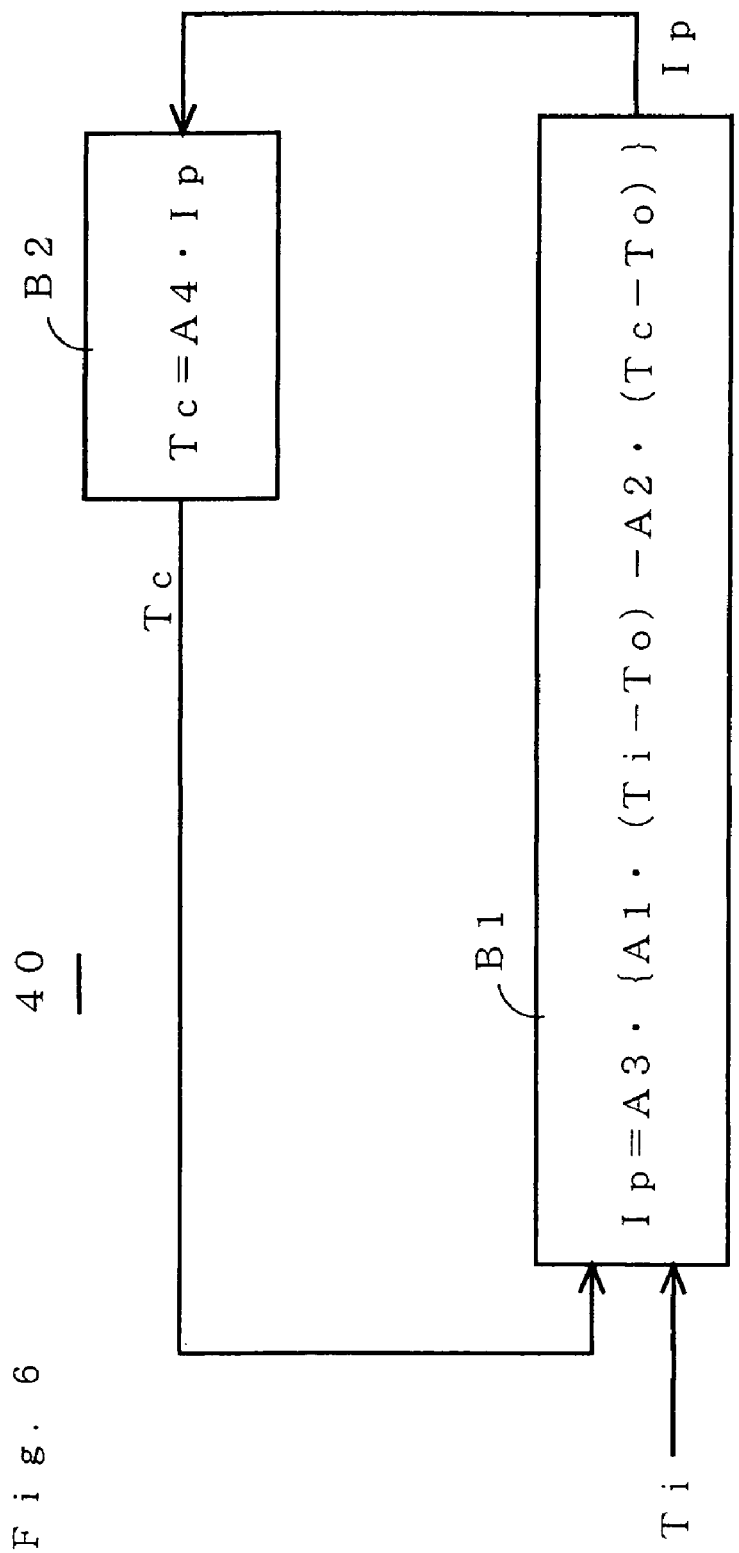
FIG. 6 is a block diagram of a control loop in a wavelength converter temperature controller of the embodiment.

FIG. 6 is a block diagram of a control loop in the wavelength converter temperature controller 40.

A block B1 represents the conversion function for the converter circuit 42, the converter circuit 43, the adder circuit 44, and the driver circuit 45. This function can be determined from the equations (2) to (6).

A block B2 represents the current-to-temperature conversion function for the Peltier device 41. This current-to-temperature conversion function is expressed by:

$$Tc = A4 \cdot Ip \tag{7}$$

where A4 is a conversion coefficient.

Then, the equation (8) is determined from the equations (2) to (7).

$$\Delta Tc = k \cdot \Delta Ti \tag{8}$$

where $$\Delta Tc = Tc - To \tag{9}$$

$$\Delta Ti = Ti - To \tag{10}$$

$$k = A1 \cdot A3 \cdot A4 / (1 + A2 \cdot A3 \cdot A4) \tag{11}$$

Assuming that the temperature coefficient of the wavelength of the fundamental wave of light released from the optical fiber 3 and received by the wavelength converter 5 is $\delta\lambda i$ nm/° C. and the temperature coefficient of the acceptable wavelength of the wavelength converter 5 is $\delta\lambda c$ nm/° C., the conversion coefficients A1 to A4 are determined so as to give $$k = \delta\lambda i / \delta\lambda c$$

or $$k \approx \delta\lambda i / \delta\lambda c.$$

For example, when $\delta\lambda i = 0.01$ nm/C.° and $\delta\lambda c = 0.06$ nm/C.°, the conversion coefficients A1 to A4 are determined so as to establish $$k = \frac{1}{6}$$

or $$k = 0.1 \text{ to } 0.2.$$

Since the temperature Tc is controlled in relation to the temperature Ti, the acceptable wavelength range of the wavelength converter 5 at the temperature Tc can remain matched with the wavelength range of reflected light from the grating part 6 at the temperature Ti.

Returning back to FIG. 5, the wavelength converter unit 50 includes the wavelength converter 5 for producing a second harmonic of the input light (the fundamental wave), a lens 51 for collimating the second harmonic light, a polarizer 52 for transmitting an extraordinary component of the second harmonic light received from the lens 51, a pair of prisms 53 and 54 for modifying the beam shape of the light released from the polarizer 52 from its oval shape to a round shape, a filter 55 for passing the second harmonic while absorbing or reflecting the component of the fundamental wave, a beam splitter 56 for separating a portion of the output light from the filter 55 while transmitting directly the other, a photometer device 57 for producing a photometry signal Sd which indicates the intensity of the separated light, a housing 11 for accommodating those components, and the Peltier device 41 for controlling the temperature (particularly on the wavelength converter 5) in the housing 11.

Both the input end 5a and the output end 5b of the wavelength converter 5 are sloped at, e.g., 10 degrees by grinding in view of attenuating the return of light. More preferably, the two ends 5a and 5b may be coated with non-reflecting layers.

The two prisms 53 and 54 are a pair of wedge-shaped prisms of which the apical angle ranges from 20 degrees to 45 degrees. Through adjusting the mounting angle of the prisms 53 and 54 respectively, any variation in the ellipticity of the beam profile of the waveguide of the wavelength converter 5 due to its individual difference can be corrected thus to have a round shape in the beam shape of the output light.

For simplification of the overall construction, the polarizer 52 may be formed integral with the prism 53 or 54. More specifically, the polarizer 52 may be replaced by the prism 53 or 54 provided at one side with a polarizing layer. Since the sloped side of the prism 53 or 54 has a degree of polarizing characteristic, the polarizing layer is preferably provided on, for instance, the first side of the prism 53 on which the laser beam is incident at a shallow angle.

The photometer device 57 may be a GaAsP photodiode.

The laser controller 60 is arranged for generating a driving current Id in response to a photometry signal Sd from the photometer device 57 thus to drive the semiconductor amplifier device 1 so that the intensity of the input light received by the photometer device 57 can stay at a predetermined level. This allows the intensity of an extraordinary component of the second harmonic light released from the wavelength converting laser apparatus 200 to remain favorably controlled.

As described, the wavelength converting laser apparatus 200 of the second embodiment can produce a linearly polarized light including the extraordinary component of light required in the bio-engineering or measuring field of industry. Also, the output of laser light can properly be controlled with no effect of an ordinary component of light.

(Third Embodiment)

Figure 7:
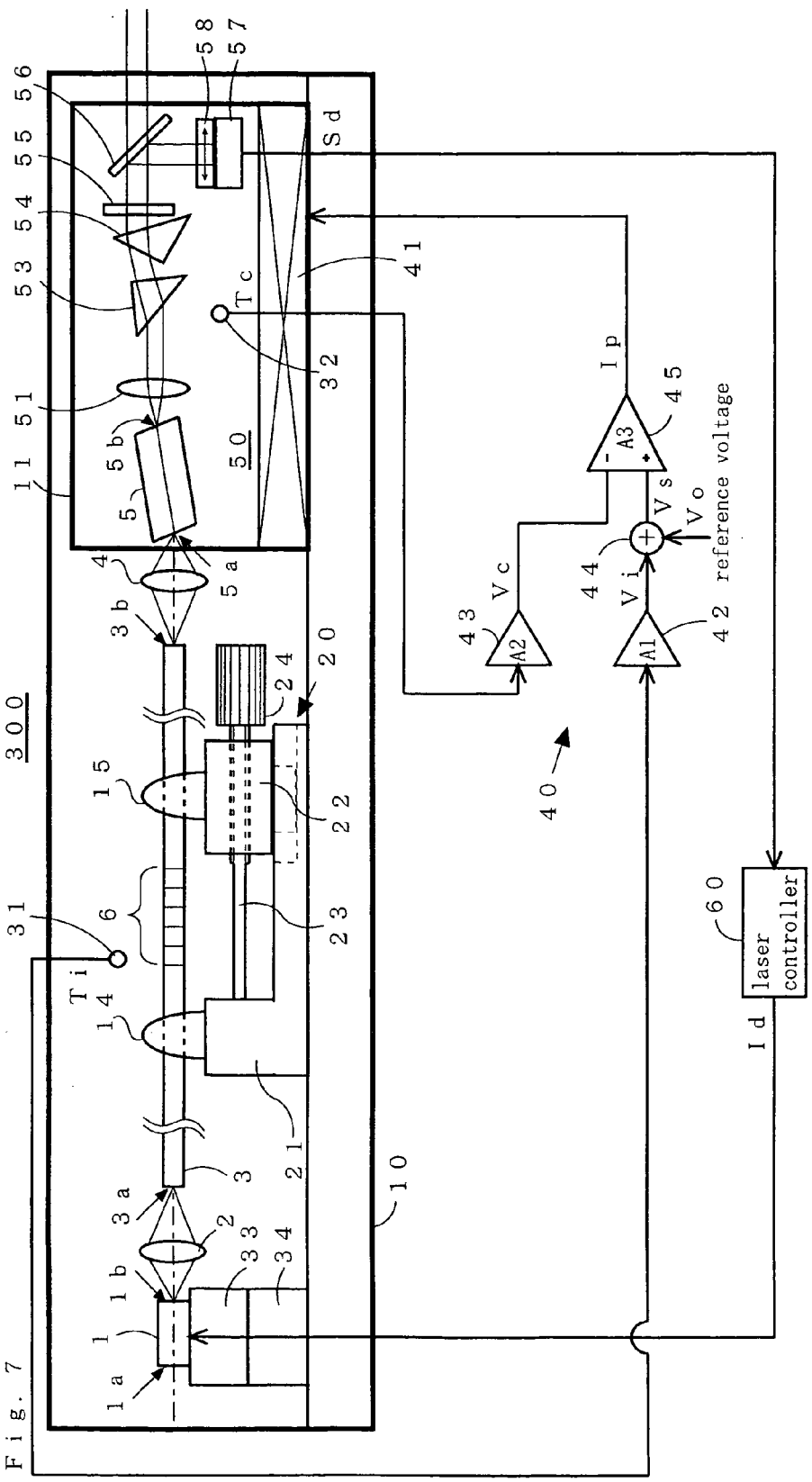
FIG. 7 is a schematic illustrative view of a wavelength converting laser apparatus 300 showing a third embodiment of the present invention.
Figure 8:
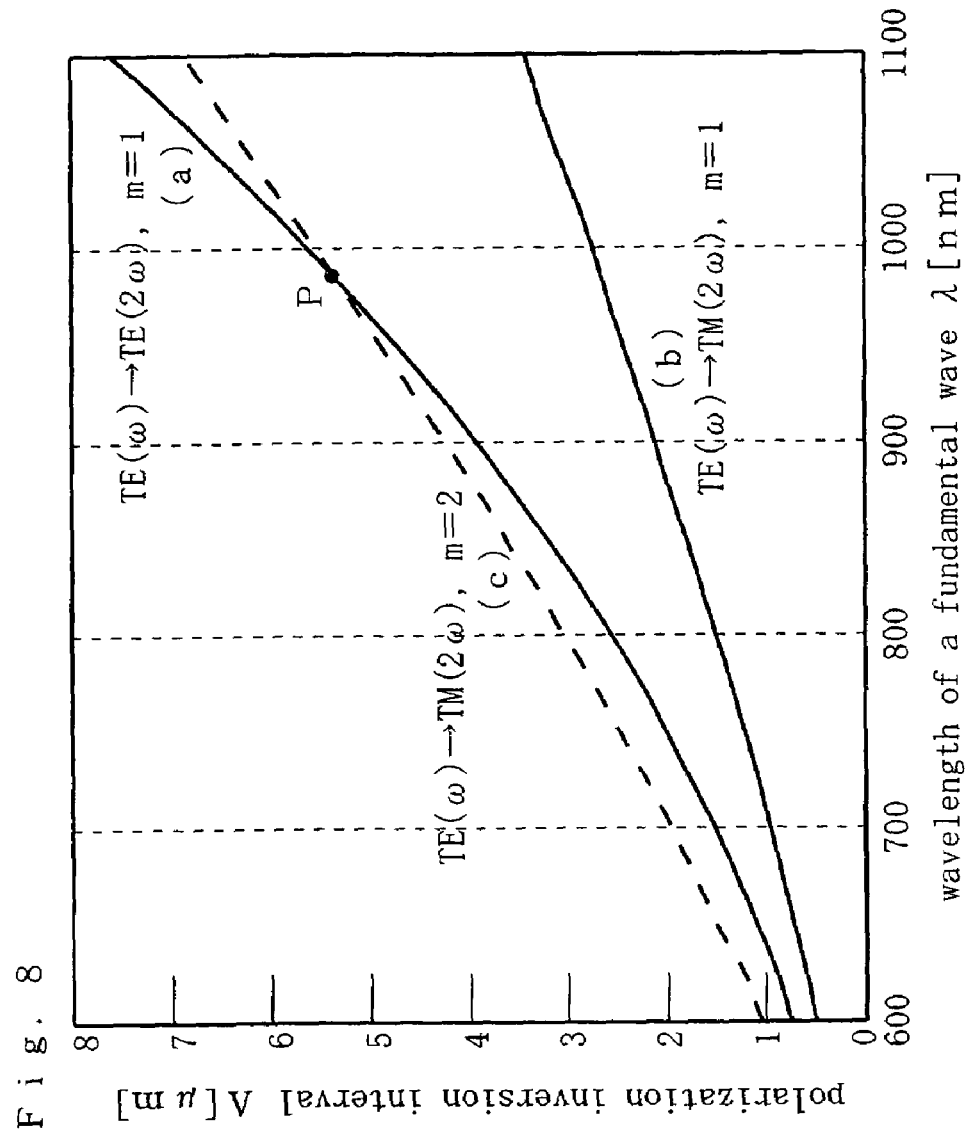
FIG. 8 is a graphic diagram showing the relationship between the wavelength λ of the fundamental wave of light and the polarization inversion interval Λ satisfying the quasi phase matching condition.
Figure 9:
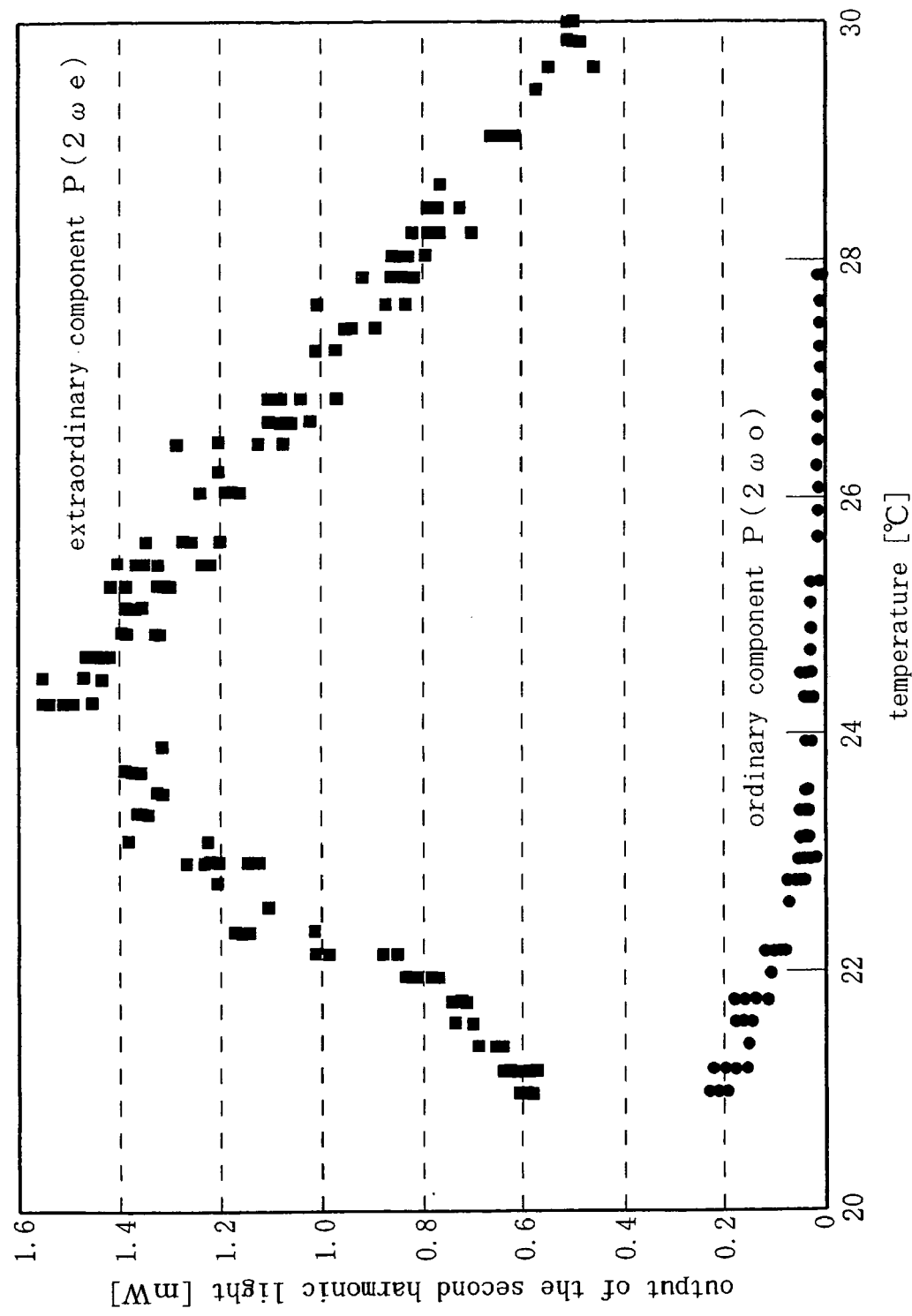
FIG. 9 is a graphic diagram showing changes in the temperature of the extraordinary component and the ordinary component contained in second harmonic light.

FIG. 7 is a schematic illustrative view of a wavelength converting laser apparatus 300 showing a third embodiment of the present invention.

The wavelength converting laser apparatus 300 is substantially identical to the wavelength converting laser apparatus 200 of the second embodiment, except that a polarizer 58 is provided between the beam splitter 56 and the photometer device 57 while no polarizer disposed between the lens 51 and the prism 53.

In the wavelength converting laser apparatus 300, the extraordinary component of light separated by the beam splitter 56 is only passed through the polarizer 58 and received by the photometer device 57. This permits the output of light to be controlled with the extraordinary component.

While the laser output contains an ordinary component and an extraordinary component of light, the wavelength converting laser apparatus 300 of the third embodiment allows the extraordinary component required particularly in the bio-engineering or measuring field of industry to be favorably controlled in the intensity of laser output. Also, its other feature is that any loss or abbreviation in the output of light due to the presence of the polarizer can be eliminated.

Industrial Applicability

The solid laser apparatus according to the present invention is allowed to be employed in such as bioengineering field and measuring field.

What is claimed is:

1. A solid laser apparatus comprising a semiconductor light emitter, an optical fiber having a grating part provided therein, a wavelength converter for receiving an input of light from an optical resonator composed of the semiconductor light emitter and the optical fiber and releasing its harmonic, a first temperature detecting means for detecting the temperature Ti of the grating part, a second temperature detecting means for detecting the temperature Tc of the wavelength converter, and a wavelength converter temperature controlling means for controlling the temperature Tc with respect to the temperature Ti so that the acceptable wavelength range of the wavelength converter at the temperature Tc is matched with the wavelength range of the fundamental wave of light released from the optical fiber and received by the wavelength converter at the temperature Ti.

2. A solid laser apparatus according to claim 1, wherein assuming that the temperature coefficient of the wavelength of the fundamental wave of light released from the optical fiber and received by the wavelength converter is $\delta\lambda i$ nm/° C., the temperature coefficient of the acceptable wavelength of the wavelength converter is $\delta\lambda c$ nm/° C., the change in the temperature Tc is $\Delta Tc$ ° C., and the change in the temperature Ti is $\Delta Ti$ ° C., the wavelength converter temperature controlling means carries out an action of temperature control so as to establish $$\Delta Tc = (\delta\lambda i/\delta\lambda c) \times \Delta Ti$$

or $$\Delta Tc \approx (\delta\lambda i/\delta\lambda c) \times \Delta Ti.$$

3. A solid laser apparatus according to claim 2, wherein when the temperature coefficient of the wavelength of the fundamental wave of light released from the optical fiber and received by the wavelength converter is $\delta\lambda i = 0.01$ nm/° C., the temperature coefficient of the acceptable wavelength of the wavelength converter is $\delta\lambda c = 0.06$ nm/° C., the change in the temperature Tc is $\Delta Tc$ ° C., the change in the temperature Ti is $\Delta Ti$ ° C., and k=0.1 to 0.2, the wavelength converter temperature controlling means carries out an action of temperature control so as to establish $$\Delta Tc = k \times \Delta Ti.$$

4. A solid laser apparatus comprising: a semiconductor light emitter, an optical fiber having a grating part provided therein, a wavelength converter having a structure of periodically poled non-linear optical crystal for receiving an input of light from an optical resonator composed of the semiconductor light emitter and the optical fiber and releasing its harmonic light, a polarizer for passing nothing but an extraordinary component of the harmonic light, an optical separating means for separating a portion of the extraordinary component passed through the polarizer, a light measuring means for measuring the intensity of the separated portion of the extraordinary component of the light, and a controlling means for driving the semiconductor light emitter in response to a measurement of the light measuring means so as to maintain the intensity of the separated portion of the extraordinary component of the light at a predetermined level.

5. A solid laser apparatus according to claim 4, further comprising a beam shaping prism for shaping the beam shape of the harmonic light released from the wavelength converter, and the beam shaping prism is constructed integral with the polarizer.

6. A solid laser apparatus comprising: a semiconductor light emitter, an optical fiber having a grating part provided therein, a wavelength converter having a structure of periodically poled non-linear optical crystal for receiving an input of light from an optical resonator composed of the semiconductor light emitter and the optical fiber and releasing its harmonic light, an optical separating means for separating a portion of the harmonic light, a polarizer for passing nothing but an extraordinary component of the separated harmonic light, a light measuring means for measuring the intensity of the extraordinary component of the light, and a controlling means for driving the semiconductor light emitter in response to a measurement the light measuring means so as to maintain the intensity of the extraordinary component of the light at a predetermined level.

7. A solid laser apparatus according to any of claims 1 to 6, wherein the wavelength converter has a structure of $LiNbO_3$ crystal doped with MgO and inverted at periodic intervals in the polarization.

* * * * *